US012656408B2

(12) United States Patent
    Zacharko et al.

(10) Patent No.: US 12,656,408 B2
(45) Date of Patent: Jun. 16, 2026

(54) ESTIMATING INTRINSIC RESISTANCE OF A COIN CELL BATTERY

(71) Applicant: QUALCOMM Incorporated, San Diego, CA (US)

(72) Inventors: Michael Aaron Zacharko, Landsdale (AU); Derrick Chu Lin, Hillsborough, CA (US); Yau Chu, Milpitas, CA (US)

(73) Assignee: Qualcomm Incorporated, San Diego, CA (US)

( * ) Notice: Subject to any disclaimer, the term of this patent is extended or adjusted under 35 U.S.C. 154(b) by 364 days.

(21) Appl. No.: 18/446,348

(22) Filed: Aug. 8, 2023

(65) Prior Publication Data

US 2024/0053409 A1     Feb. 15, 2024

Related U.S. Application Data

(60) Provisional application No. 63/449,766, filed on Mar. 3, 2023, provisional application No. 63/370,886, filed on Aug. 9, 2022.

(51) Int. Cl.
| | |
|---|---|
| *H04B 1/00* | (2006.01) |
| *G01R 31/367* | (2019.01) |
| *G01R 31/3835* | (2019.01) |
| *G01R 31/389* | (2019.01) |
| *G01R 31/392* | (2019.01) |
| *H04B 1/40* | (2015.01) |

(52) U.S. Cl.
CPC ......... *G01R 31/392* (2019.01); *G01R 31/367* (2019.01); *G01R 31/3835* (2019.01); *G01R 31/389* (2019.01); *H04B 1/40* (2013.01)

(58) Field of Classification Search
CPC ........................... G01R 31/392; G01R 31/367; G01R 31/3835; G01R 31/389; H04B 1/40
See application file for complete search history.

(56) References Cited

U.S. PATENT DOCUMENTS

| | | | |
|---|---|---|---|
| 5,869,970 | A | 2/1999 | Palm et al. |
| 6,037,778 | A | 3/2000 | Makhija |
| 2003/0149455 | A1 | 8/2003 | Obel et al. |
| 2020/0037244 | A1 | 1/2020 | Fliess |

FOREIGN PATENT DOCUMENTS

| | | | | |
|---|---|---|---|---|
| DE | 60203171 T2 | * | 12/2005 | ............. G01R 31/36 |
| EP | 0323539 A1 | * | 7/1989 | ......... G01R 31/3648 |
| KR | 102652410 B1 | * | 3/2024 | ........... G01R 31/382 |

OTHER PUBLICATIONS

International Search Report and Written Opinion—PCT/US2023/071913—ISA/EPO—Jan. 22, 2024.

* cited by examiner

*Primary Examiner* — Ping Y Hsieh

(74) *Attorney, Agent, or Firm* — Gerald P. Joyce, III

(57) ABSTRACT

Techniques and apparatus for determining intrinsic resistance and/or battery life of a coin cell battery based on the recovery time of the battery voltage after a significant current draw event. Once the intrinsic resistance and/or battery life is known, a device powered by the coin cell battery can take action to lengthen the battery's useful lifetime. One example technique of operating a device powered by a battery generally includes performing an operation with a relatively high current draw from the battery compared to other operations of the device, determining a recovery time of a voltage of the battery after the operation, and estimating a position of the battery in a lifetime of the battery based on the recovery time.

28 Claims, 5 Drawing Sheets

400

402

Perform an operation with a relatively high current draw from the battery compared to other operations of the device

404

Determine a recovery time of a voltage of the battery after the operation

406

Estimate a position of the battery in a lifetime of the battery based on the recovery time

ESTIMATING INTRINSIC RESISTANCE OF A COIN CELL BATTERY

CROSS-REFERENCE TO RELATED APPLICATION(S)

This application claims the benefit of and priority to U.S. Provisional Application No. 63/370,886, filed Aug. 9, 2022, and U.S. Provisional Application No. 63/449,766, filed Mar. 3, 2023, which are expressly incorporated by reference herein in their entirety as if fully set forth below and for all applicable purposes.

TECHNICAL FIELD

Certain aspects of the present disclosure generally relate to electronic circuits and, more particularly, to estimating intrinsic resistance and/or battery life of a coin cell battery based on battery voltage recovery time.

BACKGROUND

A voltage regulator provides a constant direct current (DC) output voltage regardless of changes in load current or input voltage. Voltage regulators may be classified as either linear regulators or switching regulators. While linear regulators tend to be small and compact, many applications may benefit from the increased efficiency of a switching regulator. A linear regulator may be implemented by a low-dropout (LDO) regulator, for example. A switching regulator may be implemented by a switched-mode power supply (SMPS), such as a buck converter, a boost converter, a buck-boost converter, or a charge pump.

Power management units (PMUs) are used for managing the power requirement of a host system and may include and/or control one or more voltage regulators (e.g., LDOs and/or SMPSs). A PMU may be used in battery-operated devices, such as mobile phones, tablets, laptops, wearables, etc., to control the flow and direction of electrical power in the devices. The PMU may perform a variety of functions for the device such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to determining intrinsic resistance and/or battery life of a coin cell battery based on the recovery time of the battery voltage after a significant current draw event. Once the intrinsic resistance and/or battery life is known, a device with the coin cell battery can take action to lengthen the battery's useful lifetime.

Certain aspects of the present disclosure are directed to a method of operating a device powered by a battery. The method generally includes performing an operation with a relatively high current draw from the battery compared to other operations of the device, determining a recovery time of a voltage of the battery after the operation, and estimating a position of the battery in a lifetime of the battery based on the recovery time.

Certain aspects of the present disclosure provide a device configured to be powered by a battery. The device generally includes a memory for storing executable instructions and at least one processor coupled to the memory and configured to execute the instructions to cause the device to perform an operation with a relatively high current draw from the battery compared to other operations of the device, to determine a recovery time of a voltage of the battery after the operation, and to estimate a position of the battery in a lifetime of the battery based on the recovery time.

Certain aspects of the present disclosure provide a non-transitory computer-readable medium comprising computer-executable instructions that, when executed by at least one processor of a device powered by a battery, cause the device to perform a method. The method generally includes performing an operation with a relatively high current draw from the battery compared to other operations of the device; determining a recovery time of a voltage of the battery after the operation; and estimating a position of the battery in a lifetime of the battery based on the recovery time.

Certain aspects of the present disclosure provide an apparatus configured to be powered by a battery. The apparatus generally includes means for performing an operation with a relatively high current draw from the battery compared to other operations of the apparatus, means for determining a recovery time of a voltage of the battery after the operation, and means for estimating a position of the battery in a lifetime of the battery based on the recovery time.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
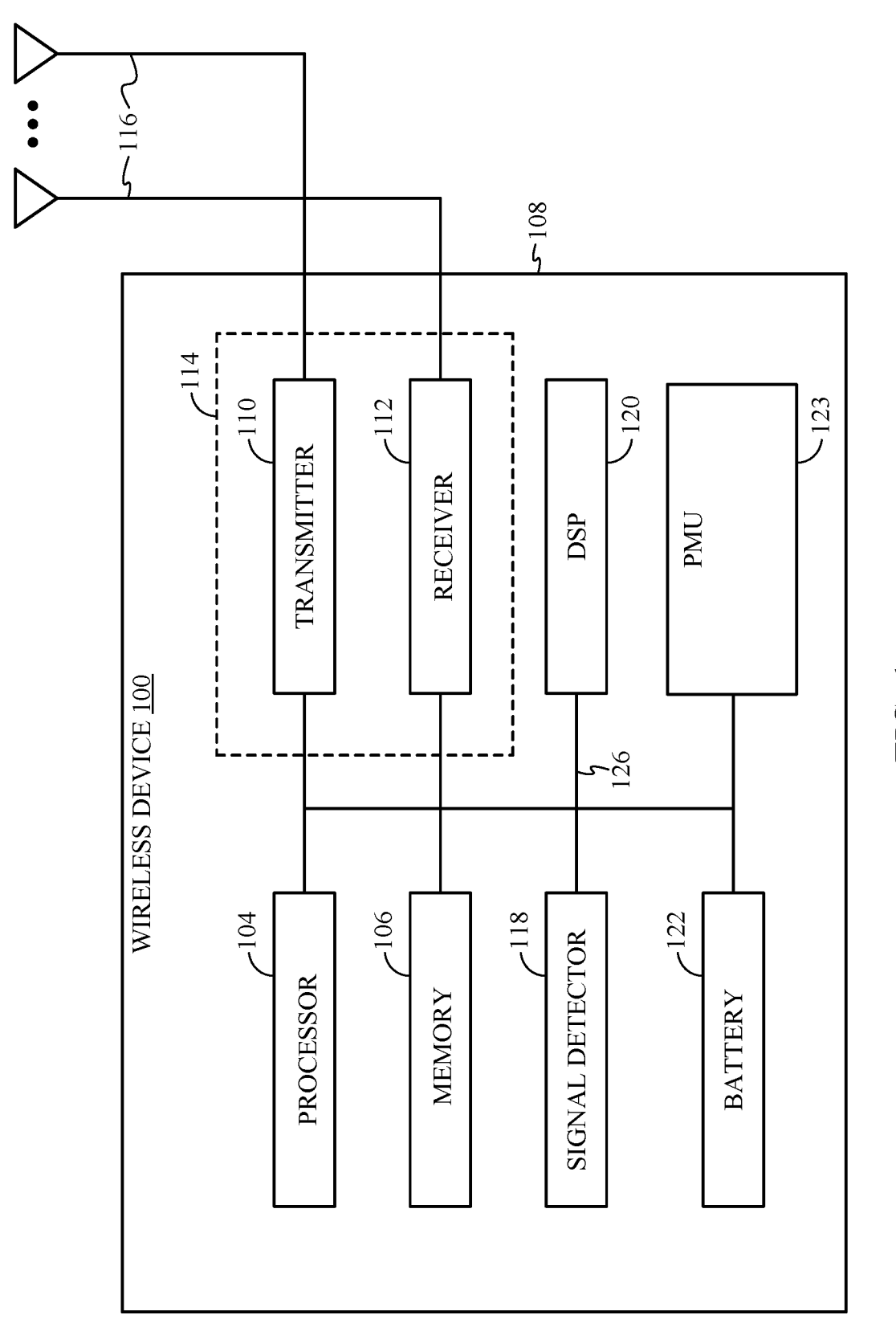
FIG. 1 is a block diagram of an example device that includes a battery coupled to a power management unit (PMU), in accordance with certain aspects of the present disclosure.

Certain aspects of the present disclosure provide techniques and apparatus for determining the intrinsic resistance and/or battery life of a coin cell battery based on the recovery time of the battery voltage after a significant current draw event. Once the intrinsic resistance and/or battery life is known, a device powered by the coin cell battery can take action to lengthen the battery's useful lifetime.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatus, such as in the power supply, battery charging circuit, or power management circuit of a communication system, a video codec, audio equipment such as music players and microphones, a television, camera equipment, and/or test equipment, such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCS s), personal digital assistants (PDAs), Internet of Things (IoT) devices, and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, a wearable device, an augmented reality device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise mechanically coupled to the housing 108 and electrically coupled to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. For certain aspects, the battery 122 may be a coin cell battery, such as a CR2032 battery, which is a round lithium battery that may be capable of delivering 220 milliampere hours (mAh), for example. The device 100 may also include a power management unit (PMU) 123 for managing the power from the battery to the various components of the device 100. At least a portion of the PMU 123 may be implemented in one or more power management integrated circuits (power management ICs or PMICs). The PMU 123 may perform a variety of functions for the device 100 such as DC-to-DC conversion, battery charging, power-source selection, voltage scaling, power sequencing, etc. For example, the PMU 123 may include a battery charging circuit (e.g., a master-slave battery charging circuit) for charging the battery 122. The PMU 123 may include one or more power supply circuits, which may include a switched-mode power supply and/or a low-dropout voltage regulator. The switched-mode power supply may be implemented by any of various suitable switched-mode power supply circuit topologies, such as a buck converter, a boost converter, or a charge pump.

The various components of the device 100 may be coupled together by a bus system 126, which may include a power bus, a control signal bus, and/or a status signal bus in addition to a data bus. Additionally or alternatively, various combinations of the components of the device 100 may be coupled together by one or more other suitable techniques.

Example Coin Cell Battery Intrinsic Resistance Determination

Micro-power Wi-Fi technology (e.g., under the IEEE 802.11 family of standards, such as IEEE 802.11n) enables Wi-Fi devices to run under coin cell batteries (e.g., CR2032 batteries) and achieve usable battery life.

Coin cell battery intrinsic resistance (RINT) stays relatively constant until a point in the battery's lifecycle where RINT increases (e.g., exponentially), typically at about the half-life of the battery. As RINT increases, RINT may limit the ability of the battery to power certain functions—such as high-powered Wi-Fi transmission or extensive Wi-Fi reception (e.g., involved in over-the-air (OTA) updates)—until a point where eventually the battery becomes unusable.

Figure 2:
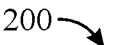
FIG. 2 is an example graph of intrinsic resistance versus used capacity of a coin cell battery, in accordance with certain aspects of the present disclosure.
Figure 2:
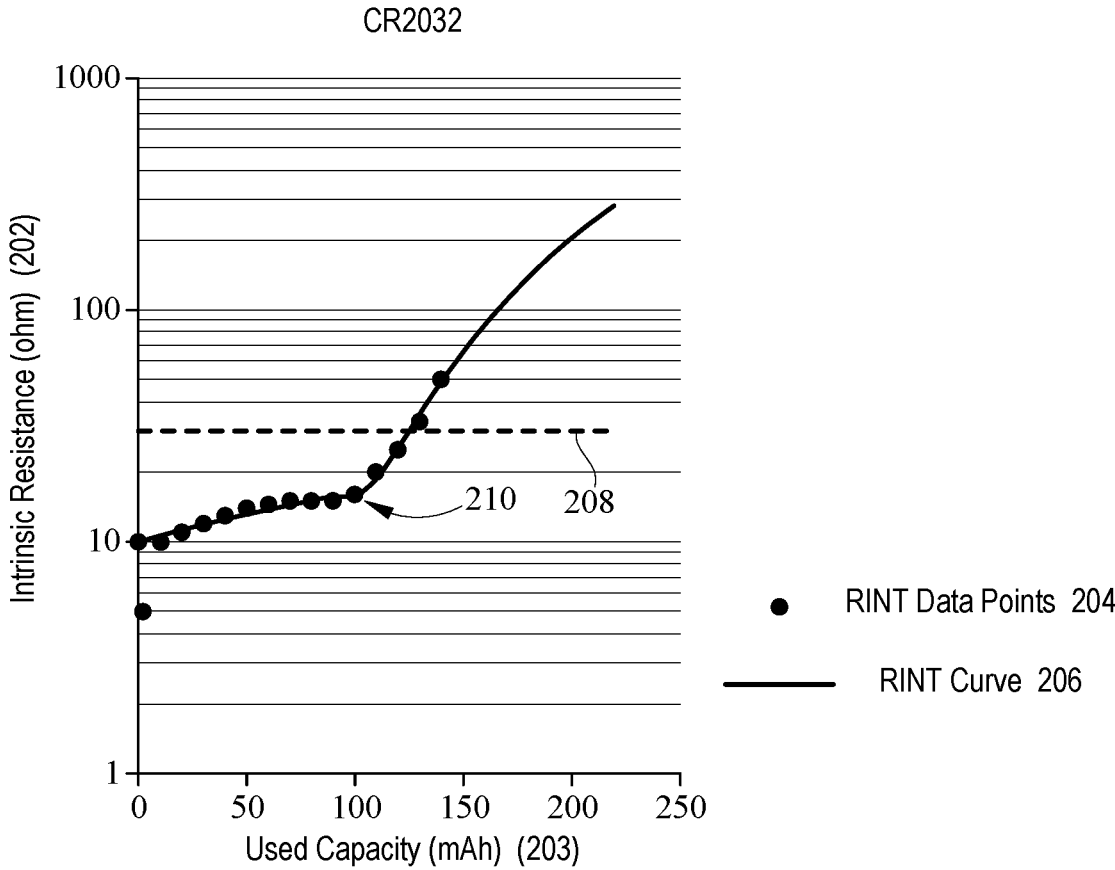

FIG. 2 is a semi-logarithmic graph 200 of RINT 202 (in Ω on a logarithmic scale) versus used capacity 203 (in mAh on a linear scale) of an example CR2032 coin cell battery. The RINT 202 of the coin cell battery is represented in FIG. 2 by both the RINT data points 204 of the RINT 202 at different used capacities and by the RINT curve 206, which is fitted to the RINT data points 204. As illustrated in the graph 200, the RINT 202 of the coin cell battery tends to stay low and relatively constant when the coin cell battery is new (i.e., the used capacity is relatively low). The RINT 202 increases exponentially after about the halfway point in the battery's lifecycle (e.g., at a used capacity of about 100 to 110 mAh). As illustrated in FIG. 2, the RINT 202 increases at a relatively linear rate up to a used capacity of about 100 mAh. After the used capacity reaches about 100 mAh, the RINT 202 begins to increase exponentially. A rising inflection point 210 on the RINT curve 206 demarcates this change from RINT increasing linearly to increasing exponentially.

The graph 200 also includes a line 208 representing the max RINT (e.g., 40 to 50Ω) for a 30 mA load. After the RINT 202 crosses the line 208, the coin cell battery may be unable to provide sufficient current for certain operations of a device (e.g., operations involving a current draw of more than 30 mA).

The time it takes the coin cell battery voltage to recover after a significant current draw event, such as Wi-Fi transmission, is proportional to the intrinsic resistance of the coin cell battery. Understanding the timeline for coin cell battery voltage recovery provides an estimation of RINT, which can be used to either limit or restrict the power used by certain functions. As RINT increases, the battery voltage recovery time generally increases.

Certain aspects of the present disclosure provide a mechanism to estimate RINT and/or the remaining life of the coin cell battery. By determining the battery voltage recovery time, a number of methods may be used to estimate RINT. For example, a running average recovery time (e.g., with a sudden, significant increase) can indicate an RINT increase inflection point (e.g., the inflection point 210 as illustrated in the graph 200) has been reached. Once a device powered by the coin cell battery establishes that the RINT increase inflection point of the coin cell battery has been reached, the device may take one or more actions to lengthen the useful lifetime of the coin cell battery. For example, the device may lengthen the useful lifetime of the coin cell battery by reducing transmit power, reducing transmission burst length, transmitting using physical layer (PHY) rates involving less power, reducing the idle period before entering a low power state, exiting the low power state less frequently, and the like.

Figure 3A:
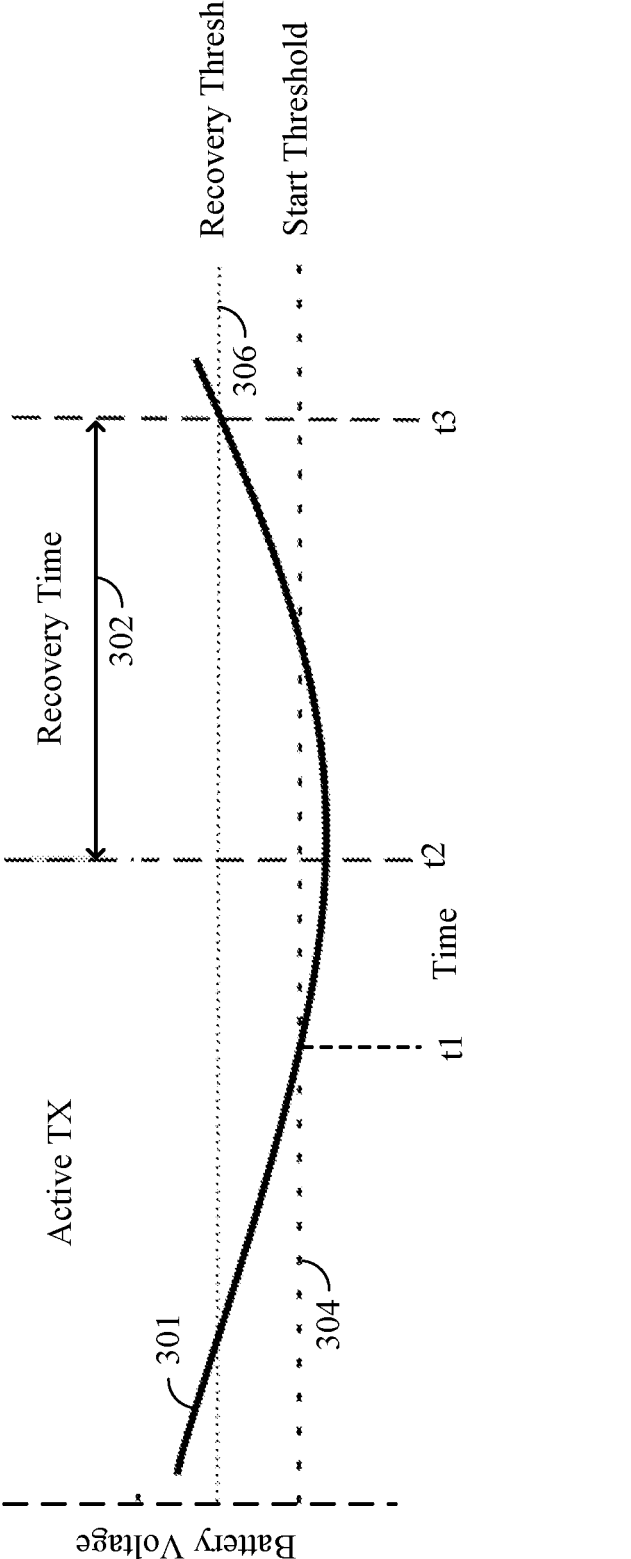
FIGS. 3A and 3B are example plots of battery voltage illustrating recovery after a voltage drop, in accordance with certain aspects of the present disclosure.

FIG. 3A is an example plot 300 of battery voltage 301 with time, illustrating battery voltage recovery time 302, in accordance with certain aspects of the present disclosure.

According to certain aspects of the present disclosure, estimating RINT may involve monitoring the battery voltage during an active transmission (TX) (the interval labeled "Active TX"), as shown in plot 300. If the battery voltage 301 drops below a start threshold 304 at time t1, measurement logic (e.g., in the PMU 123 or processor 104 of the device 100) may be engaged. For certain aspects, the start threshold 304 may be programmable.

Once the active TX is completed and the battery voltage has dropped to its local minimum level at time t2, the time taken for the battery voltage 301 to recover to a recovery threshold 306 at time t3 may be measured (during the interval labeled "Recovery Time" in the plot 300). This time is the battery voltage recovery time 302 (e.g., the time difference between times t3 and t2). For certain aspects, the recovery threshold 306 may be programmable. The recovery time measurement may be performed as a one-off measurement in some cases, or over a window of time in other cases. In the latter case, the worst-case recovery time in the window may be reported as the measured recovery time.

Software running on the device may be provided with detailed information regarding the starting voltage level (e.g., the lowest battery voltage after crossing the staring threshold 304), the ending voltage level (e.g., the maximum of the recovery threshold 306 or the highest battery voltage achieved during the recovery time 302), and/or the time taken for the battery voltage 301 to recover (e.g., the recovery time 302). This will allow software to adjust power levels and/or functions of the device based on the estimated battery lifetime (which is based on the intrinsic resistance, which is estimated from the recovery time).

Figure 3B:
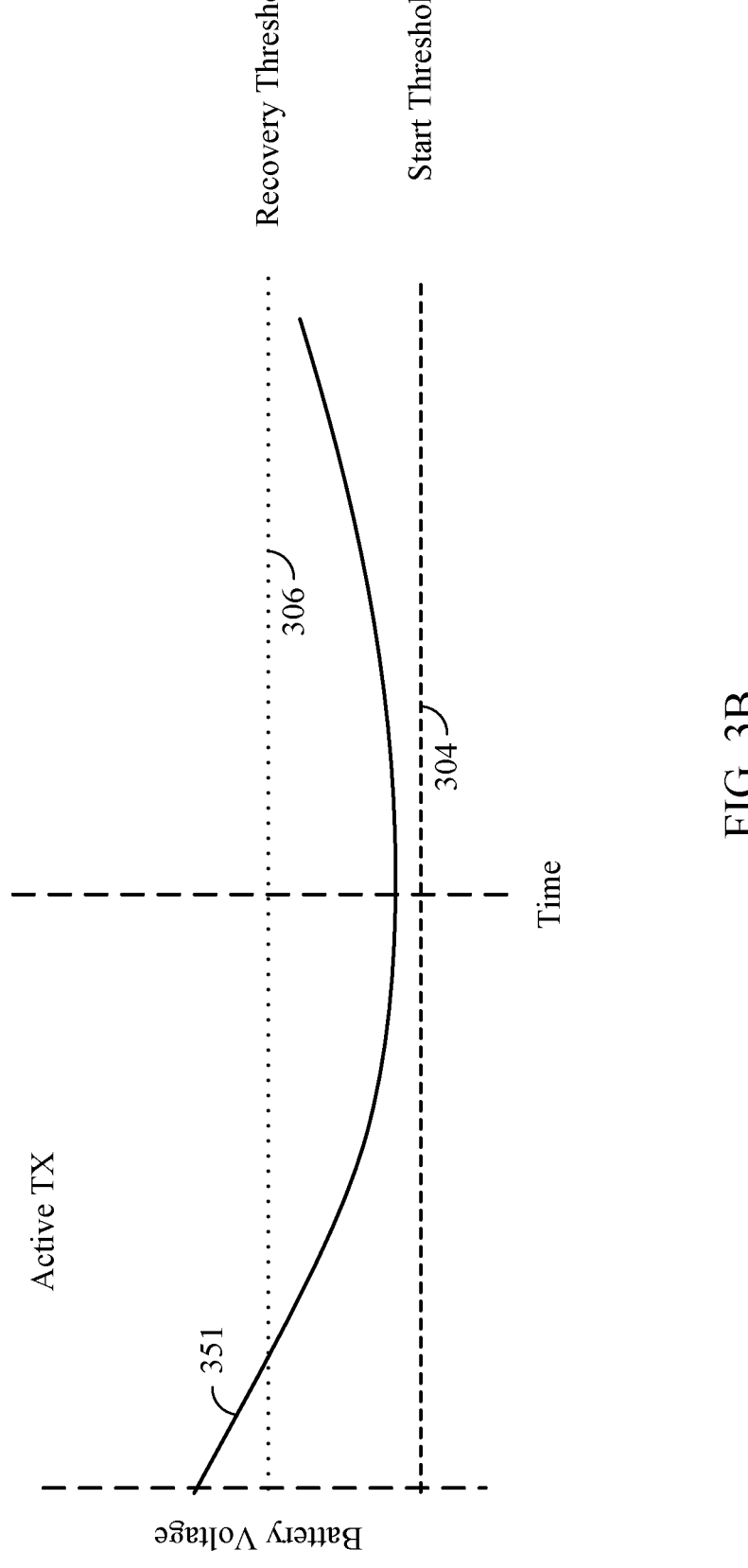

FIG. 3B is an example plot 350 of battery voltage 351 with time, illustrating recovery from a voltage drop, in accordance with certain aspects of the present disclosure.

In the example plot 350, the battery voltage 351 does not drop below the start threshold 304 during the active TX, and as a result, the measurement logic may not be engaged, thereby saving battery power and/or memory. That is, the time taken for the battery voltage 351 to recover to the recovery threshold 306 may not be measured.

Figure 4:
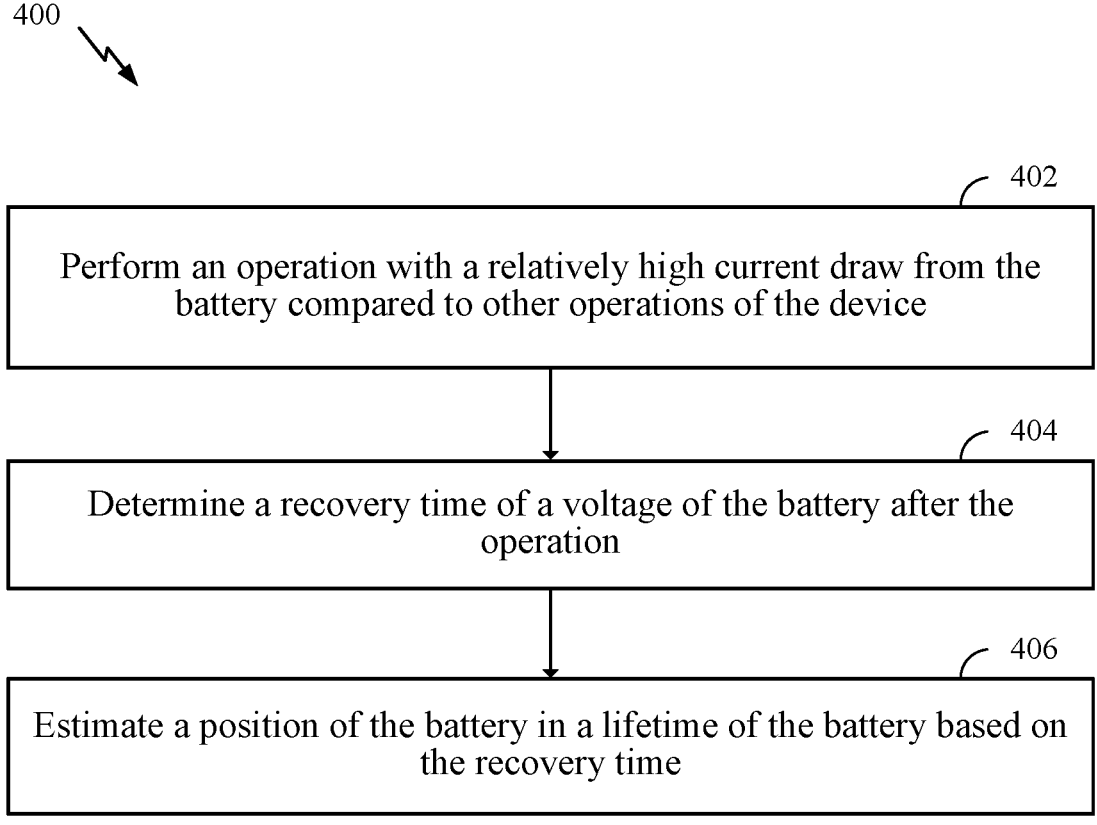
FIG. 4 is a flow diagram illustrating example processes for operating a device powered by a battery, in accordance with certain aspects of the present disclosure.

Example Operations Using Coin Cell Battery Intrinsic Resistance Determination FIG. 4 is a flow diagram illustrating example operations 400 for operating a device (e.g., device 100) powered by a battery (e.g., battery 122), in accordance with certain aspects of the present disclosure. The operations 400 may be performed by the device, and at least some of the operations 400 may be controlled by a power management unit (PMU) (e.g., PMU 123) and/or one or more processors (e.g., processor 104) in the device.

The operations 400 may begin, at block 402, with the device performing an operation with a relatively high current draw from the battery compared to other operations of the device. For example, the operation with the relatively high current draw may include transmitting a wireless signal from the device. As another example, the operation with the relatively high current draw may include receiving a wireless signal at the device. In this case, the wireless signal received at the device may include an over-the-air (OTA) update for the device.

At block 404, the device may determine a recovery time (e.g., recovery time 302) of a voltage of the battery (e.g., battery voltage 301, 351) after the operation is performed at block 402.

At block 406, the device may estimate a position of the battery in a lifetime of the battery based on the recovery time. In certain aspects, estimating the position of the battery includes determining whether the battery is in a second half of the lifetime of the battery. In this case, the operations 400 may further include taking one or more actions to lengthen a usable life of the battery when the battery is determined to be in the second half of the lifetime of the battery.

According to certain aspects, determining the recovery time at block 404 includes performing a running average of the recovery time. In this case, estimating the position of the battery in the lifetime of the battery at block 406 may involve determining a rising inflection point (e.g., inflection point 210) has occurred in the running average of the recovery time.

According to certain aspects, the operations 400 may further include estimating an intrinsic resistance (e.g., RINT 202) of the battery based on the recovery time of the voltage of the battery after the operation. In this case, estimating the position of the battery in the lifetime may be based on the estimated intrinsic resistance. In some aspects, estimating the intrinsic resistance of the battery includes performing a running average of the estimated intrinsic resistance. In this case, estimating the position of the battery in the lifetime of the battery may include determining that a rising inflection point has occurred in the running average of the estimated intrinsic resistance.

According to certain aspects, the operations 400 may further include the device monitoring the voltage of the battery. In this case, the operation with the relatively high current draw may cause the voltage of the battery to drop during the operation. In certain aspects, determining the recovery time includes measuring a time taken from an end of the operation to the voltage of the battery reaching a first threshold voltage (e.g., a recovery threshold 306). The first threshold voltage may be programmable. In certain aspects, the operations 400 may further include the device determining whether the voltage of the battery drops below a second threshold voltage (e.g., a start threshold 304). In this case, determining the recovery time at block 404 and estimating the position of the battery at block 406 may be performed only if the voltage of the battery drops below the second threshold voltage. In certain aspects, at least one of the first threshold voltage or the second threshold voltage may be programmable.

According to certain aspects, the operations 400 may further include the device taking one or more actions to lengthen a usable life of the battery based on the estimated position of the battery in the lifetime of the battery. For example, taking one or more actions may include at least one of: reducing a transmit power of the device, reducing a transmission burst length of the device, transmitting using a rate involving less power, reducing an idle period before entering a low power state for the device, exiting the low power state less frequently, or any combination thereof.

In certain aspects, the battery may be a coin cell battery. For example, the coin cell battery may be a CR2032 battery.

In certain aspects, the device may be an Internet of things (IoT) device.

Example Clauses

Implementation examples are described in the following numbered clauses:

Clause 1: A method of operating a device powered by a battery, the method comprising: performing an operation with a relatively high current draw from the battery compared to other operations of the device; determining a recovery time of a voltage of the battery after the operation; and estimating a position of the battery in a lifetime of the battery based on the recovery time.

Clause 2: The method of Clause 1, wherein the estimating comprises determining whether the battery is in a second half of the lifetime of the battery.

Clause 3: The method of Clause 2, further comprising taking one or more actions to lengthen a usable life of the battery when the battery is determined to be in the second half of the lifetime of the battery.

Clause 4: The method of any of Clauses 1 to 3, further comprising estimating an intrinsic resistance of the battery based on the recovery time of the voltage of the battery after the operation, wherein estimating the position of the battery in the lifetime is based on the estimated intrinsic resistance.

Clause 5: The method of Clause 4, wherein estimating the intrinsic resistance of the battery comprises performing a running average of the estimated intrinsic resistance and wherein estimating the position of the battery in the lifetime of the battery comprises determining a rising inflection point has occurred in the running average of the estimated intrinsic resistance.

Clause 6: The method of any of Clauses 1 to 5, wherein determining the recovery time comprises performing a running average of the recovery time and wherein estimating the position of the battery in the lifetime of the battery comprises determining a rising inflection point has occurred in the running average of the recovery time.

Clause 7: The method of any of Clauses 1 to 6, further comprising monitoring the voltage of the battery, wherein the operation with the relatively high current draw causes the voltage of the battery to drop during the operation and wherein determining the recovery time comprises measuring a time taken from an end of the operation to the voltage of the battery reaching a first threshold voltage.

Clause 8: The method of Clause 7, wherein the first threshold voltage is programmable.

Clause 9: The method of Clause 7 or 8, further comprising determining whether the voltage of the battery drops below a second threshold voltage, wherein determining the recovery time and estimating the position of the battery are performed only if the voltage of the battery drops below the second threshold voltage.

Clause 10: The method of Clause 9, wherein at least one of the first threshold voltage or the second threshold voltage is programmable.

Clause 11: The method of any of Clauses 1 to 10, wherein the operation with the relatively high current draw comprises transmitting a wireless signal from the device.

Clause 12: The method of any of Clauses 1 to 11, wherein the operation with the relatively high current draw comprises receiving a wireless signal at the device.

Clause 13: The method of Clause 12, wherein the wireless signal received at the device comprises an over-the-air (OTA) update for the device.

Clause 14: The method of any of Clauses 1 to 13, further comprising taking one or more actions to lengthen a usable life of the battery based on the estimated position of the battery in the lifetime of the battery.

Clause 15: The method of Clause 14, wherein taking the one or more actions comprises at least one of: reducing a transmit power of the device; reducing a transmission burst length of the device; transmitting using a rate involving less power; reducing an idle period before entering a low power state for the device; exiting the low power state less frequently; or any combination thereof.

Clause 16: The method of any of Clauses 1 to 15, wherein the battery is a coin cell battery.

Clause 17: The method of Clause 16, wherein the coin cell battery is a CR2032 battery.

Clause 18: The method of any of Clauses 1 to 17, wherein the device is an Internet of Things (IoT) device.

Clause 19: An apparatus comprising: a memory and at least one processor coupled to the memory and configured to cause the apparatus to perform a method in accordance with any of Clauses 1 to 18.

Clause 20: An apparatus comprising means for performing a method in accordance with any of Clauses 1 to 18.

Clause 21: A non-transitory computer-readable medium comprising computer-executable instructions that, when executed by at least one processor of an apparatus, cause the apparatus to perform a method in accordance with any of Clauses 1 to 18.

Clause 22: A device configured to be powered by a battery, the device comprising: a memory for storing executable instructions; and at least one processor coupled to the memory and configured to execute the instructions to: cause the device to perform an operation with a relatively high current draw from the battery compared to other operations of the device; determine a recovery time of a voltage of the battery after the operation; and estimate a position of the battery in a lifetime of the battery based on the recovery time.

Clause 23: The device of Clause 22, wherein to estimate the position of the battery, the at least one processor is configured to determine whether the battery is in a second half of the lifetime of the battery.

Clause 24: The device of Clause 23, wherein the at least one processor is further configured to cause the device to take one or more actions to lengthen a usable life of the battery when the battery is determined to be in the second half of the lifetime of the battery.

Clause 25: The device of any of Clauses 22 to 24, wherein the at least one processor is further configured to estimate an intrinsic resistance of the battery based on the recovery time of the voltage of the battery after the operation and wherein the at least one processor is configured to estimate the position of the battery in the lifetime of the battery based on the estimated intrinsic resistance.

Clause 26: The device of Clause 25, wherein to estimate the intrinsic resistance of the battery, the at least one processor is configured to perform a running average of the estimated intrinsic resistance and wherein estimating the position of the battery in the lifetime of the battery, the at least one processor is configured to determine a rising inflection point has occurred in the running average of the estimated intrinsic resistance.

Clause 27: The device of any of Clauses 22 to 26, wherein to determine the recovery time, the at least one processor is configured to perform a running average of the recovery time and wherein to estimate the position of the battery in the lifetime of the battery, the at least one processor is configured to determine a rising inflection point has occurred in the running average of the recovery time.

Clause 28: The device of any of Clauses 22 to 27, wherein the at least one processor is further configured to monitor the voltage of the battery, wherein the operation with the relatively high current draw is configured to cause the voltage of the battery to drop during the operation and wherein to determine the recovery time, the at least one processor is configured to determine a time taken from an end of the operation to the voltage of the battery reaching a first threshold voltage.

Clause 29: The device of Clause 28, wherein the first threshold voltage is programmable.

Clause 30: The device of Clause 28 or 29, wherein to determine the recovery time, the at least one processor is further configured to determine whether the voltage of the battery drops below a second threshold voltage, and the at least one processor is configured to determine the recovery time and to estimate the position of the battery only if the voltage of the battery drops below the second threshold voltage.

Clause 31: The device of Clause 30, wherein at least one of the first threshold voltage or the second threshold voltage is programmable.

Clause 32: The device of any of Clauses 22 to 31, wherein the device is an Internet of Things (IoT) device.

Clause 33: A non-transitory computer-readable medium comprising computer-executable instructions that, when executed by at least one processor of a device powered by a battery, cause the device to perform a method, the method comprising: performing an operation with a relatively high current draw from the battery compared to other operations of the device; determining a recovery time of a voltage of the battery after the operation; and estimating a position of the battery in a lifetime of the battery based on the recovery time.

Clause 34: An apparatus configured to be powered by a battery, the apparatus comprising: means for performing an operation with a relatively high current draw from the battery compared to other operations of the apparatus; means for determining a recovery time of a voltage of the battery after the operation; and means for estimating a position of the battery in a lifetime of the battery based on the recovery time.

ADDITIONAL CONSIDERATIONS

The various operations of methods described above may be performed by any suitable means capable of performing the corresponding functions. The means may include various hardware and/or software component(s) and/or module(s), including, but not limited to a circuit, an application-specific integrated circuit (ASIC), or a processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A method of operating a device powered by a battery, the method comprising:
   performing an operation with a relatively high current draw from the battery compared to other operations of the device;
   determining a recovery time of a voltage of the battery after the operation;
   estimating an intrinsic resistance of the battery based on the recovery time of the voltage of the battery after the operation; and
   estimating a position of the battery in a lifetime of the battery based on the estimated intrinsic resistance.

2. The method of claim 1, wherein the estimating comprises determining whether the battery is in a second half of the lifetime of the battery.

3. The method of claim 2, further comprising taking one or more actions to lengthen a usable life of the battery when the battery is determined to be in the second half of the lifetime of the battery.

4. The method of claim 1, wherein the operation with the relatively high current draw comprises transmitting a wireless signal from the device.

5. The method of claim 1, wherein the operation with the relatively high current draw comprises receiving a wireless signal at the device.

6. The method of claim 5, wherein the wireless signal received at the device comprises an over-the-air (OTA) update for the device.

7. The method of claim 1, further comprising taking one or more actions to lengthen a usable life of the battery based on the estimated position of the battery in the lifetime of the battery.

8. The method of claim 1, wherein the battery is a coin cell battery.

9. The method of claim 8, wherein the coin cell battery is a CR2032 battery.

10. The method of claim 1, wherein estimating the intrinsic resistance of the battery comprises performing a running average of the estimated intrinsic resistance and wherein estimating the position of the battery in the lifetime of the battery comprises determining a rising inflection point has occurred in the running average of the estimated intrinsic resistance.

11. A method of operating a device powered by a battery, the method comprising:
   performing an operation with a relatively high current draw from the battery compared to other operations of the device;

determining a recovery time of a voltage of the battery after the operation, wherein determining the recovery time comprises performing a running average of the recovery time; and
   estimating a position of the battery in a lifetime of the battery based on the recovery time, wherein estimating the position of the battery in the lifetime of the battery comprises determining a rising inflection point has occurred in the running average of the recovery time.

12. A method of operating a device powered by a battery, the method comprising:
   monitoring a voltage of the battery;
   performing an operation with a relatively high current draw from the battery compared to other operations of the device, wherein the operation with the relatively high current draw causes the voltage of the battery to drop during the operation;
   determining a recovery time of the voltage of the battery after the operation, wherein determining the recovery time comprises measuring a time taken from an end of the operation to the voltage of the battery reaching a first threshold voltage; and
   estimating a position of the battery in a lifetime of the battery based on the recovery time.

13. The method of claim 12, wherein the first threshold voltage is programmable.

14. The method of claim 12, further comprising determining whether the voltage of the battery drops below a second threshold voltage, wherein determining the recovery time and estimating the position of the battery are performed only if the voltage of the battery drops below the second threshold voltage.

15. The method of claim 14, wherein at least one of the first threshold voltage or the second threshold voltage is programmable.

16. A device configured to be powered by a battery, the device comprising:
   memory for storing executable instructions; and
   at least one processor coupled to the memory and configured to execute the instructions to:
      cause the device to perform an operation with a relatively high current draw from the battery compared to other operations of the device;
      determine a recovery time of a voltage of the battery after the operation;
      estimate an intrinsic resistance of the battery based on the recovery time of the voltage of the battery after the operation; and
      estimate a position of the battery in a lifetime of the battery based on the estimated intrinsic resistance.

17. A method of operating a device powered by a battery, the method comprising:
   performing an operation with a relatively high current draw from the battery compared to other operations of the device;
   determining a recovery time of a voltage of the battery after the operation;
   estimating a position of the battery in a lifetime of the battery based on the recovery time; and
   taking one or more actions to lengthen a usable life of the battery based on the estimated position of the battery in the lifetime of the battery, wherein taking the one or more actions comprises at least one of:
   reducing a transmit power of the device;
   reducing a transmission burst length of the device;
   transmitting using a rate involving less power;

reducing an idle period before entering a low power state for the device;

exiting the low power state less frequently; or any combination thereof.

18. The device of claim 16, wherein to estimate the intrinsic resistance of the battery, the at least one processor is configured to perform a running average of the estimated intrinsic resistance and wherein to estimate the position of the battery in the lifetime of the battery, the at least one processor is configured to determine a rising inflection point has occurred in the running average of the estimated intrinsic resistance.

19. The device of claim 16, wherein to estimate the position of the battery, the at least one processor is configured to determine whether the battery is in a second half of the lifetime of the battery.

20. The device of claim 19, wherein the at least one processor is further configured to cause the device to take one or more actions to lengthen a usable life of the battery when the battery is determined to be in the second half of the lifetime of the battery.

21. The device of claim 16, wherein the device is an Internet of Things (IoT) device.

22. A device configured to be powered by a battery, the device comprising:

memory for storing executable instructions; and at least one processor coupled to the memory and configured to execute the instructions to:

cause the device to perform an operation with a relatively high current draw from the battery compared to other operations of the device;

determine a recovery time of a voltage of the battery after the operation, wherein to determine the recovery time, the at least one processor is configured to perform a running average of the recovery time; and estimate a position of the battery in a lifetime of the battery based on the recovery time, wherein to estimate the position of the battery in the lifetime of the battery, the at least one processor is configured to determine a rising inflection point has occurred in the running average of the recovery time.

23. A device configured to be powered by a battery, the device comprising:

memory for storing executable instructions; and at least one processor coupled to the memory and configured to execute the instructions to:

monitor a voltage of the battery;

cause the device to perform an operation with a relatively high current draw from the battery compared to other operations of the device, wherein the operation with the relatively high current draw is configured to cause the voltage of the battery to drop during the operation;

determine a recovery time of a voltage of the battery after the operation, wherein to determine the recovery time, the at least one processor is configured to determine a time taken from an end of the operation to the voltage of the battery reaching a first threshold voltage; and estimate a position of the battery in a lifetime of the battery based on the recovery time.

24. The device of claim 23, wherein the first threshold voltage is programmable.

25. The device of claim 23, wherein to determine the recovery time, the at least one processor is further configured to determine whether the voltage of the battery drops below a second threshold voltage and the at least one processor is configured to determine the recovery time and to estimate the position of the battery only if the voltage of the battery drops below the second threshold voltage.

26. The device of claim 25, wherein at least one of the first threshold voltage or the second threshold voltage is programmable.

27. A non-transitory computer-readable medium comprising computer-executable instructions that, when executed by at least one processor of a device powered by a battery, cause the device to perform a method, the method comprising:

performing an operation with a relatively high current draw from the battery compared to other operations of the device;

determining a recovery time of a voltage of the battery after the operation;

estimating an intrinsic resistance of the battery based on the recovery time of the voltage of the battery after the operation; and estimating a position of the battery in a lifetime of the battery based on the estimated intrinsic resistance.

28. An apparatus configured to be powered by a battery, the apparatus comprising:

means for monitoring a voltage of the battery;

means for performing an operation with a relatively high current draw from the battery compared to other operations of the apparatus, wherein the operation with the relatively high current draw causes the voltage of the battery to drop during the operation;

means for determining a recovery time of a voltage of the battery after the operation, wherein the means for determining the recovery time is configured to measure a time taken from an end of the operation to the voltage of the battery reaching a threshold voltage; and means for estimating a position of the battery in a lifetime of the battery based on the recovery time.

* * * * *